United States Patent [19]
Crook et al.

[11] Patent Number: 5,475,231
[45] Date of Patent: Dec. 12, 1995

[54] APPARATUS FOR MONITORING ION BEAMS WITH AN ELECTRICALLY ISOLATED APERTURE

[75] Inventors: Thomas M. Crook, New Brighton; Delmer L. Smith, Edina; Robert G. Ahonen, Cedar, all of Minn.

[73] Assignee: Honeywell Inc., Minneapolis, Minn.

[21] Appl. No.: 124,906

[22] Filed: Sep. 21, 1993

[51] Int. Cl.⁶ .................................................. H01J 3/12
[52] U.S. Cl. .................................................. 250/397
[58] Field of Search .............................................. 250/397

[56] References Cited

U.S. PATENT DOCUMENTS

| | | | |
|---|---|---|---|
| Re. 33,193 | 4/1990 | Yamaguchi et al. | 250/309 |
| 4,118,630 | 10/1978 | McKenna et al. | 250/492.2 |
| 4,135,097 | 1/1979 | Forneris et al. | 250/492.2 |
| 4,628,209 | 12/1986 | Wittkower | 250/492.2 |
| 4,633,172 | 12/1986 | Ekdahl, Jr. et al. | 324/126 |
| 4,939,371 | 7/1990 | Goto | 250/397 |
| 4,992,742 | 2/1991 | Okuda et al. | 324/71.3 |
| 5,025,167 | 6/1991 | Okuda et al. | 250/397 |

*Primary Examiner*—Jack I. Berman
*Attorney, Agent, or Firm*—Ronald E. Champion; Craig J. Lervick

[57] ABSTRACT

An apparatus for monitoring ion beams with an electrically isolated aperture includes an ion beam source for generating an ion beam and an electrically conductive aperture plate arranged to collimate the ion beam. The aperture plate is electrically isolated from the rest of the deposition apparatus and is divided into a plurality of electrically isolated segments. A current monitoring device has an input connected to the aperture plate so as to monitor current from the aperture plate which is indicative of the ion beam performance.

8 Claims, 3 Drawing Sheets

APPARATUS FOR MONITORING ION BEAMS WITH AN ELECTRICALLY ISOLATED APERTURE

BACKGROUND OF THE INVENTION

1. Field of the Invention

The present invention relates to ion beam sputtering and, more particularly, to a method for monitoring ion beams with an electrically isolated aperture. Still more particularly, the present invention is directed to a method of fabricating optical mirrors.

2. Discussion of the Prior Art

U.S. Pat. No. 4,992,742 to Okuda et al. discloses a device for measuring the distribution of charged particles. A plate having through holes is provided to restrict the passage of the beam. The current distribution induced on the plate is then measured so that a uniform ion beam can be provided over a target area. The present invention, on the other hand, measures the current on an aperture plate so that the size of the aperture can be adjusted to correct for beam divergence.

U.S. Pat. No. 4,633,172 to Ekdahl, Jr. et al. shows an in-line beam current monitor for measuring total electron beam current. Unlike the present invention, Ekdahl, Jr. et al. are not concerned with measuring the current realized by electrically isolated aperture plates. The current measured by the present invention is indicative of grid condition and change in beam divergence. The present invention corrects the size of the aperture in accordance with the measured current.

U.S. Pat. No. 4,628,209 to Wittkower shows a device for measuring the spatial intensity distribution of a beam. Wittkower rotates a plate having targets separated by apertures. As the beam passes through the aperture, it is received by a Faraday cup. The current observed in the Faraday cup measures the beam intensity passing through each of the apertures. Unlike the present invention, Wittkower does not measure the current at the aperture plate for the purpose of adjusting the aperture size.

U.S. Pat. No. 4,135,097 to Forneris et al. and U.S. Pat. No. 4,118,630 to McKenna et al. each show an ion beam apparatus which controls the surface potential of a target surface. Forneris et al. and McKenna et al. measure the ion beam current of the target surface and adjacent electrically insulated walls in order to minimize the positive charge buildup on the insulated surface. The present invention is not concerned with the current at the target, but the current at the aperture plate.

U.S. Re. Pat. No. 33,193 to Yamaguchi et al. discloses an ion beam apparatus having an adjustable aperture. However, Yamaguchi et al. do not adjust the aperture in response to a measured current on the aperture.

The prior art references discussed above show conventional techniques for measuring beam current. However, these prior art references, do not measure the current from an aperture plate. The present invention, on the other hand, measures current from an isolated aperture plate for the purpose of adjusting the aperture size to correct for beam divergence. None of the references above seek to solve beam divergence. The present invention further utilizes the aperture current to signify grid condition.

Referring now to FIG. 1, an ion beam sputtering apparatus of the prior art is shown. In ion beam sputtering, ions are accelerated from a region in which they are generated, called the plasma source 10, by means of suitably electrified grids 12, 14, and directed at high energies onto a target 33. An ion beam 16 is generally indicated by an arrow. On impact, material from the target is sputtered off and subsequently received by suitably located substrates, resulting in the deposition of target material. An aperture plate 20 is generally employed in such a system. The aperture plate 20 is typically affixed to a mounting plate 22 by means of mounting posts 24 or other suitable mounting apparatus.

The aperture plate 20 serves at least two purposes. First, it intercepts parts of the ion beam 16 which are divergent from the main beam direction. These divergent parts may otherwise deleteriously impinge on materials other than the desired target materials inside the deposition chamber. Sputtering of such non-target materials in the deposition chamber is highly undesirable. Second, when depositing highly insulative materials, such as silicon dioxide, some amount of the target material may be deposited on the front 32, or target side, of the grid 12. Thus, transforming the surface of this grid from a conductor to an insulating coating. Such a coating may accumulate electrical charges to an extent that arcing occurs, with detrimental effects to the desired deposition process.

By intercepting a suitable amount of the ion beam, material 30 from the aperture plate 20 can be back sputtered onto the grid surface to an extent sufficient to maintain adequate conductivity on the grid surface. Such back sputtering permits the accumulating charges to bleed off harmlessly, thus preventing arcing at the grids 12, 14.

It is desirable to keep the size of the aperture in aperture plate 20 as large as possible while maintaining its functions. If the divergence of the ion beam changes, as, for example, from grid misalignments or from grid dimensional changes due to erosion during operation, the optimal aperture opening changes. Using the aperture of the prior art, it is difficult to monitor such changes either dynamically during a deposition process, or even statically between such processes.

SUMMARY OF THE INVENTION

In contrast to the prior art, the present invention provides an apparatus for monitoring ion beams with an electrically isolated aperture plate which is divided into a plurality of electrically isolated segments. An ion beam source, which provides an ion beam, and the electrically conductive aperture plate are arranged so that the aperture plate provides an aperture suitable for collimating the ion beam. A current monitoring device has an input connected to each segment of the aperture plate so as to monitor aperture plate current. Such an embodiment may permit allocating beam distribution changes among transverse spatial components.

In operation, the present invention offers a means to monitor the divergence of the ion beam, and any changes in such divergence, by monitoring the net current drawn by the aperture plate 20. The aperture plate 20, is electrically isolated from all other components of the deposition system including the chamber, target and ion source. However, the aperture plate 20 is maintained at a virtual electrical ground by means of an operational amplifier, or equivalent. Thus the plate functions in a manner identical to that of a conventional aperture. The net current to the aperture may now be measured during the sputtering operation.

The measured current comprises several current components such as, for example, incoming ions, electron emissions, sometimes called "secondaries", from energetic ion or atom impingement, and electrons available to the aperture from an electron emitter or electron emitters, sometimes called "neutralizers", used inside the chamber to prevent charge build-ups on impacted surfaces and to reduce beam spreading from electrical repulsive forces. The present invention permits the potential of the aperture plate 20 to be adjusted slightly away from ground potential in order to optimize the sensitivity of the device to beam changes. Thus the aperture plate 20 may be maintained at a slightly negative potential to reduce recapture of secondary electrons or collection of neutralizer electrons. Because of the high energy of the positive ions in the ion beam itself, attractive effects for these positive ions due to the slightly negative aperture are minimal.

Monitoring the net current present in the aperture plate provides a measure of changes in beam divergence, alerting an operator to the need for corrective action such as, for example, grid maintenance or adjustment. This monitor can also serve to facilitate adjustment for optimal aperturing under differing parameters of ion beam operation.

Other objects features and advantages of the invention will become apparent to those skilled in the art through the description of the preferred embodiment, claims and drawings herein, wherein like figures in the several views indicate like elements.

BRIEF DESCRIPTION OF THE DRAWINGS

To illustrate this invention, a preferred embodiment will be described herein with reference to the accompanying drawings.

DETAILED DESCRIPTION OF THE PREFERRED EMBODIMENT

Figure 1:
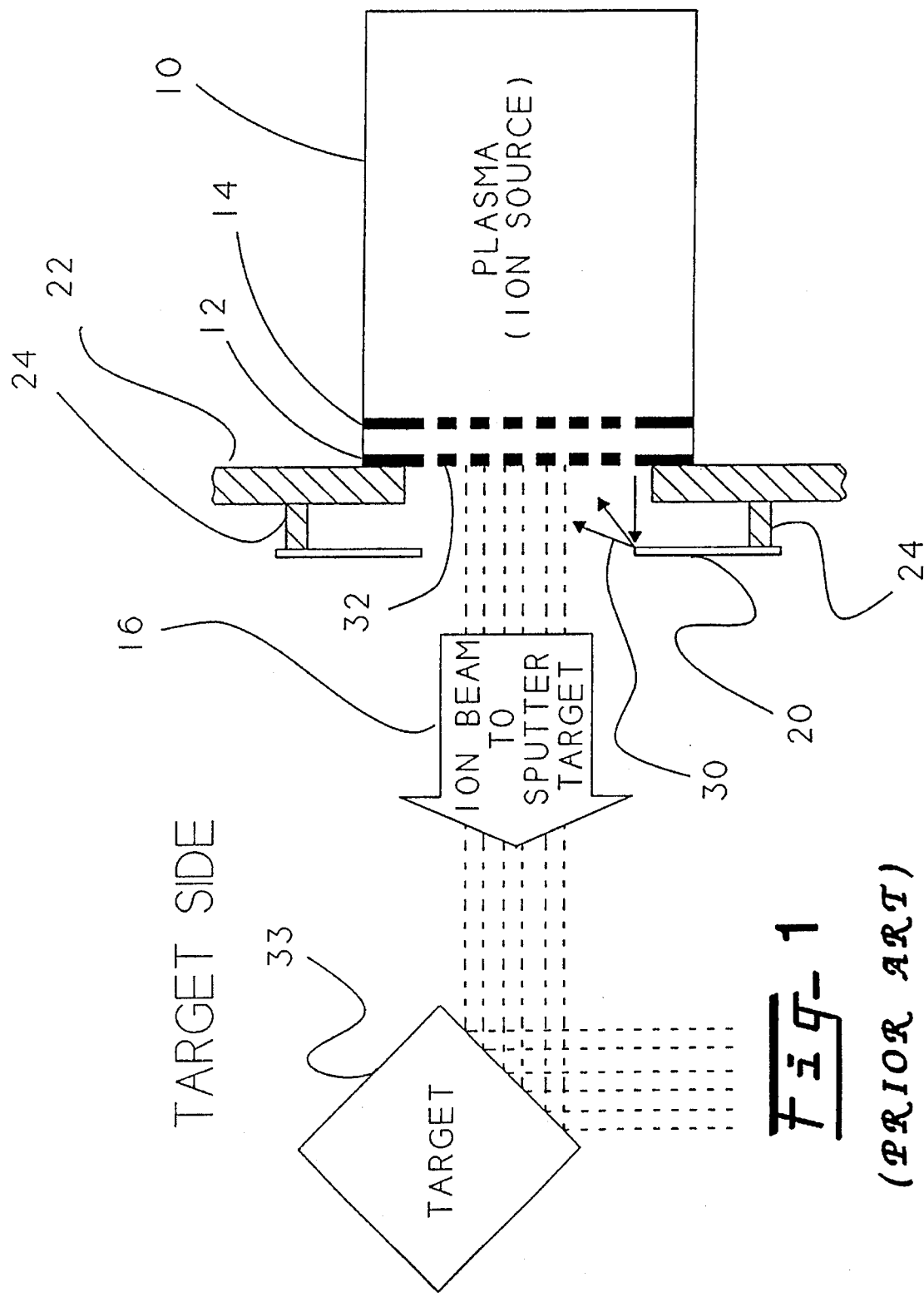
FIG. 1 shows schematically an apparatus for ion beam sputtering as used in the prior art.
Figure 2:
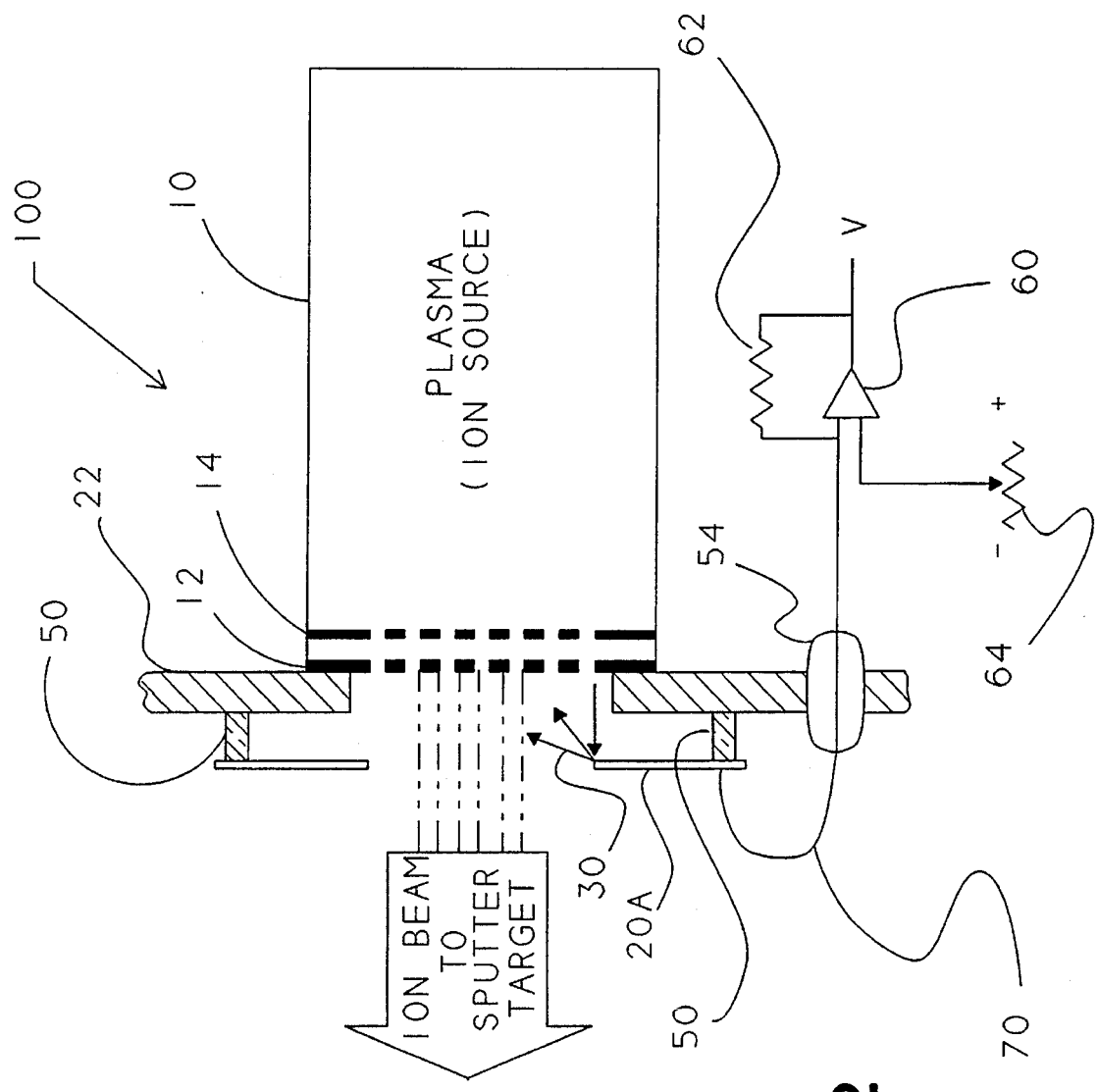
FIG. 2 shows schematically an ion beam sputtering apparatus including a monitor apparatus connected to a segmented aperture plate.

Now referring to FIG. 2, apparatus for monitoring ion beams with an electrically isolated aperture is shown. The apparatus 100 comprises a plasma or ion source 10, electrified grids 12, 14, a mounting plate 22, mounting elements 50, segmented aperture plate 20A, and an operational amplifier 60 having associated feedback element 62 and adjustment element 64. The segmented aperture plate 20A is advantageously mounted so as to be electrically isolated. In one example, the segmented aperture plate 20A may be mounted to the mounting plate 22 by means of mounting elements 50 where the mounting elements 50 comprise a material which is not electrically conductive. Each mounting element 50 may advantageously be made of any well known insulator capable of supporting the mounting plate. In one example, the insulators may be comprised of ceramic posts or similar materials. Of course, other mounting apparatus may be used.

A conductor 70 may be electrically connected to the segmented aperture plate 20A. Wire 70 is routed out of the deposition chamber to the monitoring apparatus. In one example, the wire 70 may be routed through the mounting plate 22 through insulator feedthrough 54. The insulator feedthrough 54 may be any suitable insulator capable of isolating the wire 70 from the mounting plate 22. The wire 70 is fed into a monitoring device as, for example, a conventional ammeter, or the operational amplifier 60 as shown. In the illustrated example, the operational amplifier 60 may be arranged in a conventional feedback circuit having feedback element 62 and reference element 64, which is adjustable.

By monitoring a voltage V at the output, which is proportional to the current drawn by a monitored portion of the segmented aperture plate, an operator may observe any changes in the current drawn by the segmented aperture plate 20A. This aperture plate current is indicative of ion beam collimation. In response to any such changes, the operator may make such adjustments as are required to improve beam performance. For example, the operator may increase the aperture opening or decrease the aperture opening, as the case may be, depending upon the application and the desired results. In another case, the grids 12, 14 may be replaced or cleaned. In operation, the voltage V may be connected to a visual display for ease in monitoring the current to the segmented aperture plate. Of course, other suitable current measurement devices such as conventional ammeters may be employed to monitor the aperture plate current.

Figure 3:
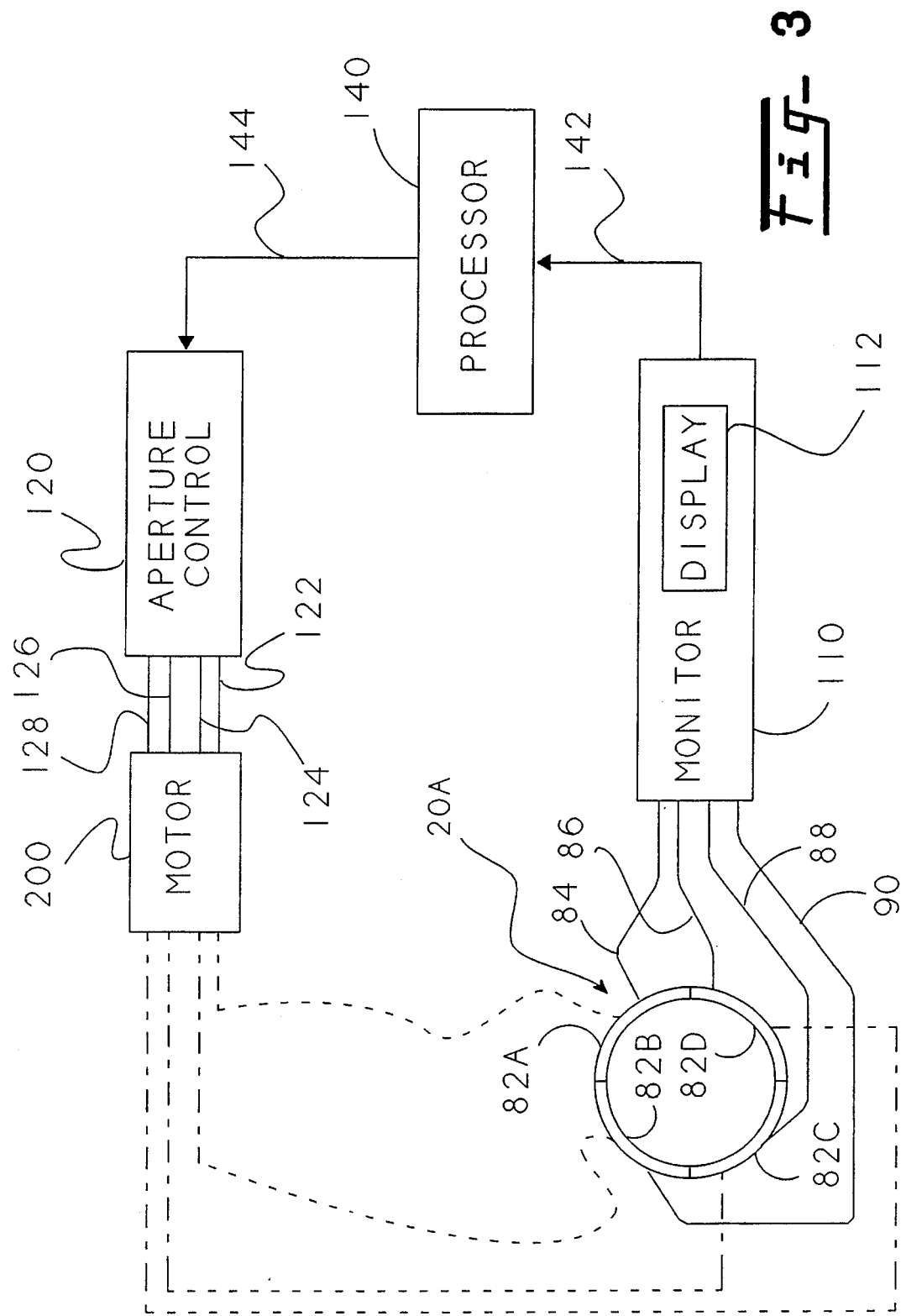
FIG. 3 shows an embodiment of the present invention wherein the aperture plate is segmented into a plurality of electrically isolated sections.

Referring now to FIG. 3, an embodiment of the present invention is shown wherein the aperture plate comprises a plurality of electrically isolated sections with each section monitored as discussed herein above. Further, each section may be connected to a readout and power supply device for monitoring and control. Shown in FIG. 3 is such a segmented aperture plate 20A including segments 82A, 82B, 82C and 82D. Each segment is connected by means of a conductor 84, 86, 88 or 90 respectively, to monitor device 110. Monitor device 110 may preferably include a display 112. While the example herein shows a segmented aperture including four segments, it will be clear to those skilled in the art that the number of conductive shield segments 82A–82D, may be based on the resolution required for monitoring the aperture plate. Thus, more or fewer segments may be used depending upon the resolution desired. Operation of this apparatus provides an effective real time check of ion source performance.

Additionally shown are processor 140 and a control means 120. The processor 140 may advantageously be coupled to an output of the monitor 110 by line 142 to receive monitor information. The processor 140 then processes the monitor information from line 142 and provides an output on line 144 to control apparatus 120. Control apparatus 120 uses the processed information from line 144 to provide control signals for each of the aperture segments on control lines 122, 124, 126 and 128, respectively. For example, in response to monitor readings which indicate that the aperture plate is experiencing increased current due to increased divergence of the ion beam, the processor may receive such information on line 142 in the form of digital or analog information which is then converted in the processor to digital information in a well known manner. The processor may then pass on that information to the controller which outputs a signal responsive to the digital information from line 144 to automatically reposition the voltage on the aperture segments so as to collimate the ion beam as necessary. Automatic mechanical adjustments may be made by means of a conventional stepper motor or other mechanism shown here as motor 200. The aperture control 120 may be designed in a conventional manner to operate motor 200 in response to the aperture plate current value, thereby eliminating the need for operator intervention.

The invention has been described herein in considerable detail in order to comply with the Patent Statutes and to provide those skilled in the art with the information needed to apply the novel principles and to construct and use such specialized components as are required. However, it is to be understood that the invention may be carried out by specifically different equipment and devices, and that various modifications, both as to the equipment details and operating procedures, may be accomplished without departing from the scope of the invention itself.

What is claimed is:

1. An apparatus for monitoring ion beams with an electrically isolated aperture comprising:

an ion beam source producing an ion beam;

an electrically conductive aperture plate mounted so as to be electrically isolated and located so as to operate to collimate the ion beam wherein the electrically conductive aperture plate is comprised of a plurality of electrically isolated segments;

means for monitoring current having an input connected to the electrically conductive aperture plate so as to monitor an aperture plate current and having an output for producing a signal indicative of the aperture plate current;

a processor having an input connected to the monitor output, the processor further having a processor output which carries a signal proportional to the aperture plate current;

position adjustment means for adjusting the position of each of the plurality of aperture plate segments; and a control apparatus having an input connected to the processor output, the control apparatus further having a plurality of control outputs connected to the position adjustment wherein each of the plurality of control outputs is responsive to the processor output so as to provide an adjustment signal to the position adjustment means which in response adjusts each of the plurality of aperture plate segments.

2. The apparatus of claim 1 wherein each of the electrically isolated segments are individually connected to the monitoring means.

3. The apparatus of claim 1 wherein the monitoring means comprises an operational amplifier having a voltage output responsive to the aperture plate current.

4. The apparatus of claim 1 wherein the ion beam source comprises a plasma region having at least one electrified grid located proximate the plasma region.

5. A method for monitoring ion beams with an electrically isolated aperture and collimating the ion beams in response to the monitoring, comprising the steps of:

operating an ion beam source;

mounting an electrically conductive aperture plate proximate the ion beam source where the electrically conductive aperture plate is electrically isolated;

segmenting the electrically conductive aperture plate into a plurality of electrically isolated segments;

monitoring an aperture plate current for each of the plurality of isolated segments; and repositioning the aperture plate in response to the monitored aperture plate current when an imbalance exists between the plurality of isolated segments.

6. The method of claim 5 wherein the step of monitoring an aperture plate current further comprises the steps of:

(a) providing a monitor output for each of the plurality of isolated segments; and (b) generating a plurality of control outputs responsive to each monitor output.

7. An apparatus for monitoring ion beams with an electrically isolated aperture comprising:

means for generating an ion beam;

means for forming an aperture disposed proximate the ion beam generating means wherein the means for forming an aperture is electrically conductive and electrically isolated and wherein the aperture forming means is comprised of a plurality of electrically isolated segments;

means for monitoring aperture plate current connected to the means for forming an aperture, wherein each of the electrically isolated segments are individually connected to the means for monitoring, and wherein the monitoring means has an output;

means for processing having an input connected to the monitoring means output, the processing means also having a processor output which carries a signal proportional to the aperture plate current;

position adjustment means for adjusting the position of the electrically isolated segments connected to the electrically isolated aperture plate segments; and a means for control having an input connected to the processor output, the control means further having a plurality of control outputs connected to the position adjustment means wherein each of the plurality of control outputs is responsive to the processor output so as to provide an adjustment signal to cause the positional adjustment of the electrically isolated segments thereby collimating the ion beam.

8. The apparatus of claim 7 wherein the means for monitoring comprises an operational amplifier having a voltage output responsive to the aperture plate current.

* * * * *